United States Patent [19]
Choi

[11] Patent Number: 5,790,454
[45] Date of Patent: Aug. 4, 1998

[54] DATA SENSING APPARATUS AND METHOD OF MULTI-BIT MEMORY CELL

[75] Inventor: Woong Lim Choi, Chungcheongbuk-do, Rep. of Korea

[73] Assignee: LG Semicon Co., Ltd., Chungcheongbuk-Do, Rep. of Korea

[21] Appl. No.: 839,789

[22] Filed: Apr. 18, 1997

[30] Foreign Application Priority Data

Jun. 26, 1996 [KR] Rep. of Korea ............... 24097/1996

[51] Int. Cl.$^6$ ............................................. G11C 16/06
[52] U.S. Cl. ........................ 365/185.03; 365/185.2; 365/189.09; 365/189.12; 365/189.05; 365/189.02; 365/194
[58] Field of Search .................... 365/185.03, 185.2, 365/189.09, 189.12, 189.05, 189.02, 194

[56] References Cited

U.S. PATENT DOCUMENTS

| | | | |
|---|---|---|---|
| 4,331,968 | 5/1982 | Gosney, Jr. et al. | 365/185.14 |
| 5,043,940 | 8/1991 | Harari | 365/185.03 |
| 5,047,362 | 9/1991 | Bergemont | 438/257 |
| 5,163,021 | 11/1992 | Mehrotra et al. | 365/185.03 |
| 5,268,318 | 12/1993 | Harari | 438/263 |
| 5,394,362 | 2/1995 | Banks | 365/185.03 |
| 5,422,842 | 6/1995 | Cernea et al. | 365/185.22 |
| 5,495,442 | 2/1996 | Cernea et al. | 365/185.03 |
| 5,539,690 | 7/1996 | Talreja et al. | 365/185.22 |
| 5,594,691 | 1/1997 | Bashir | 365/189.09 |

OTHER PUBLICATIONS

M. Bauer, et al., A multilevel-Cell 32 Mb Flash Memory, 1995 IEEE International Solid-State Circuits Conference, 1995, pp. 132-133.

Raul Cernea, et al., A 34MB 3.3V Serial EEPROM for Solid-State Disk Applications, 1995 IEEE International Solid-State Circuits Conference, 1995, pp. 126-127.

*Primary Examiner*—David C. Nelms
*Assistant Examiner*—Andrew Q. Tran
*Attorney, Agent, or Firm*—Morgan, Lewis & Bockius LLP

[57] ABSTRACT

A data sensing apparatus and method of a multi-bit memory cell includes a first step of generating $2^m-1$ different reference voltages, a second step of applying a first intermediate reference voltage between at least two of the reference voltages to a control gate of the memory cell and outputting a binary bit as a highest bit depending upon detection of a drain current from the memory cell, and a third step of applying a second intermediate reference voltage between at least two of the reference voltages among the reference voltages lower than the first intermediate reference voltage applied to the control gate when the drain current is detected in the second step, and applying a third intermediate reference voltage between at least two of the reference voltages among the reference voltages higher than the first intermediate reference voltage applied to the control gate at the memory cell when the drain current is not detected, so as to output a lowest bit by repeatedly outputting data depending on whether the drain current is detected.

17 Claims, 7 Drawing Sheets

DATA SENSING APPARATUS AND METHOD OF MULTI-BIT MEMORY CELL

This application claims the benefit of Korean Patent Application No. 24097/1996 filed Jun. 26, 1996, which is hereby incorporated by reference.

BACKGROUND OF THE INVENTION

1. Field of the Invention

The present invention relates to an apparatus and method for reading data from a semiconductor device, and more particularly, to a data sensing apparatus and method of multi-bit cell. Although the present invention is suitable for a wide range of applications, it is particularly suitable for reading data from a memory cell programmed in two or multilevels.

2. Discussion of the Related Art

Generally, a semiconductor memory device comprises a volatile memory device and a non-volatile memory device. The volatile memory device cannot maintain data without continuous power dissipation, whereas a non-volatile memory device permanently retains its contents even when power is shut off.

Nonetheless, a random access memory (PAM) device, a volatile memory device, is frequently used because of its capability of repetitive data writing and reading. On the other hand, a non-volatile memory device includes a read-only memory (ROM), an electrically programmable read-only memory (EPROM), and an electrically erasable and programmable read-only memory (EEPROM). The ROM is not able to be reprogrammed once the data is stored. However, the EPROM and the EEPROM are recently of great interest because they can be reprogrammed even after erasing the stored data. The stored data in the EPROM can be erased using an infrared ray while the stored data in the EEPROM can be electrically erased.

With the development of computer and communication electronics, a memory device having a high capacity is in great demand. For example, a dynamic random-access memory (DRAM) is widely used as a storage media. However, the DRAM needs constant refreshing to retain data for a certain period of time because its storage capacitor has a limited capacity. As a result, a non-volatile memory device, which does not require a constant refreshing (particularly the EEPROM), has been constantly developed throughout the industry.

However, an EEPROM can read only one data, for example, either "1" or "0" in a memory cell. Thus, the EEPROM needs the same number of memory cells corresponding to a desired amount of data to be processed. This results in increasing cost per bit.

In order to avoid such problem, a multi-bit cell is actively being studied. Since the multi-bit memory cell stores data of more than 2 bits in a memory cell, a data storage integration density per chip can be largely improved without reducing the size of the memory cell.

Such a multi-bit memory cell is programmed by multi-level threshold voltages per cell. For example, to store 2-bit data per cell, a respective cell is programmed by four threshold voltage levels ($2^2$=4). The four threshold voltage levels include logic values of 00, 01, 10, and 11.

To increase the number of bits per cell programmed by multi-levels, the threshold voltage level should be precisely controlled to reduce variations from the desired voltage levels. In addition, a precise data sensing is also required at high speed.

A data sensing apparatus of a conventional multi-bit memory cell will now be described with reference to the appended drawings.

FIG. 1 is a configuration of a data sensing apparatus of a conventional multi-bit memory cell. FIG. 2 is a graph illustrating an operation of a sensing apparatus of a conventional multi-bit memory cell.

The data sensing method of the conventional multi-bit memory cell includes the steps of applying a certain voltage to a control gate to read data and determining the drain current from the applied voltage to read the multi-bit memory data.

As shown in FIG. 1, the data sensing apparatus of the conventional multi-bit memory cell includes a voltage controller VC, an EEPROM comprising a floating gate FG, a control gate CG, a source region S, a drain region D, and a sensing amplifier SA connected to the drain region D. The sensing amplifier SA has a plurality of reference currents therein and the voltage controller provides a voltage to the control gate CG.

The data sensing method of the conventional multi-bit memory cell as aforementioned will be described below in detail.

The memory cell is programmed by multi-level threshold voltages. For example, in 2-bit data writing as shown in FIG. 2, the memory cell is programmed by one of four threshold voltages, such as 0 V, $V_{T,0}$, $V_{T,1}$, and $V_{T,2}$, at the floating gate FG. A voltage $V_{READ}$ is selectively applied to the control gate CG in the memory cell to be read while applying a positive voltage to the source region S. Then, a drain current $I_D$ corresponding to the programmed memory cell at the floating gate FG is transmitted to the sensing amplifier SA. The sensing amplifier SA reads data by comparing multi-level reference currents with the drain current from the memory cell.

As shown in FIG. 2, if the memory cell data to be read in the EEPROM is programmed by the threshold voltage $V_{T,0}$ at the floating gate FG, a drain current IR1 corresponding to the programmed data is output to the sensing amplifier SA. Similarly, when the floating gate FG is programmed by the threshold voltage $V_{T,2}$, a drain current $I_{R3}$ is output to the sensing amplifier SA. A drain current $I_{R2}$ is generated with respect to the threshold voltage $V_{T,1}$.

Finally, the sensing amplifier SA compares a drain current from the memory cell with multi-level reference currents to perform the data sensing. However, the data sensing apparatus and method of the conventional multi-bit memory cell as aforementioned have several problems.

Since the sensing amplifier must compare the currents from the multi-level memory cell with the reference currents to read data, the sensing amplifier needs to have multi-level reference currents. Thus, a size of the sensing amplifier becomes larger. In particular, since a large number of bits(128 bits) are required in a page mode read, the size of the chip increases with a larger sensing amplifier. In addition, since a plurality of reference currents must be supplied with the sensing amplifier, power consumption is increased.

SUMMARY OF THE INVENTION

Accordingly, the present invention is directed to a data sensing apparatus and method of a multi-bit cell that substantially obviates one or more of the problems due to limitations and disadvantages of the related art.

An object of the present invention is to provide a data sensing apparatus and method of a multi-bit cell having reduced chip size and power consumption.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the data sensing apparatus of a multi-bit memory cell according to the present invention includes a reference voltage generator for generating a plurality of reference voltages, a switch for outputting one of a plurality of the reference voltages generated from the reference voltage generator to a control gate of the memory cell, a sensor for sensing an output signal of the memory cell in which the reference voltage is applied, a controller for controlling the switch to apply the most intermediate reference voltage to the control gate and to apply an intermediate reference voltage of lower reference voltages or higher reference voltages than the current applied reference voltage in response to an output signal of the sensor, and a shifter for outputting m-bit data by shifting the output signal of the sensor.

Further, the data sensing method of a multi-bit memory cell programmed by m-bit includes three steps of a first step for generating $2^m-1$ different reference voltages, a second step for applying an intermediate reference voltage from the reference voltages to the control gate of the memory cell and outputting the highest bit as "0" or "1" depending on whether a drain current of the memory cell is detected or not, and a third step for applying an intermediate reference voltage from lower reference voltages than the current applied reference voltage to the control gate of the memory cell if the drain current is detected, and applying an intermediate reference voltage from higher reference voltages than the current applied reference voltage to the control gate of the memory cell if the drain current is not detected, so as to output the lowest bit by repeatedly outputting data depending on whether the drain current of the memory cell is detected or not.

In another aspect, the data sensing apparatus of a multi-bit memory cell includes a reference voltage generator generating a plurality of reference voltages, a switch coupled to the reference voltage generator and outputting one of the plurality of reference voltages to the control gate of the memory cell, a sensor coupled to the multi-bit memory cell and sensing an output signal from the memory cell, a controller coupled to the switch and the senior and controlling the switch to apply an intermediate reference voltage selected from the plurality of reference voltages to the control gate, the intermediate reference voltage being different from the one of the plurality of reference voltages in response to an output signal from the sensor, and a shift register coupled to the sensor and outputting an m-bit data, the shift register shifting the output signal received from the sensor.

In another aspect, the data sensing apparatus of a multi-bit memory cell includes a reference voltage generator generating a plurality of reference voltages, a switch coupled to the reference voltage generator and outputting one of plurality of reference voltages to the control gate of the memory cell, wherein the switch includes a plurality of transistors respectively switching the plurality of reference voltages generated from the reference voltage generator in accordance with the controller and a transistor coupled to the plurality of transistors and setting outputs of the plurality of the transistors to a reset state, a sensor coupled to the multi-bit memory cell and sensing an output signal from the memory cell, a shift register coupled to the sensor and outputting an m-bit data, the shift register shifting the output signal received from the sensor, and a controller coupled to the switch and the sensor controlling the switch to apply an intermediate reference voltage selected from the plurality of reference voltages to the control gate, the intermediate reference voltage being different from the one of the plurality of reference voltages in response to an output signal from the sensor, wherein the controller includes a clock signal controller outputting a synchronized clock signal to perform data sensing in response to a main clock signal and a starting signal, a latch coupled to the clock signal controller and latching input signals using the clock signal from the clock signal controller and outputting the input signals, a selector coupled to the latch and outputting signals to input terminals at the latch in response to the signal from the sensor to select a desired reference voltage, and a decoder coupled to the latch and outputting a final reference voltage selection signal in response to the signals from the latch.

In another aspect, the data sensing apparatus of multi-bit memory cell includes a reference voltage generator generating a plurality of reference voltages, a switch coupled to the reference voltage generator and outputting one of the plurality of reference voltages to the control gate of the memory cell, wherein the switch includes a plurality of transistors respectively switching the plurality of reference voltages generated from the reference voltage generator in accordance with the controller and a transistor coupled to the plurality of transistors and setting outputs of the plurality of the transistors to a reset state, a sensor coupled to the multi-bit memory cell and sensing an output signal from the memory cell, a shift register coupled to the sensor and outputting an m-bit data, the shift register shifting the output signal received from the sensor, and a controller coupled to the switch and the sensor controlling the switch to apply an intermediate reference voltage selected from the plurality of reference voltages to the control gate, the intermediate reference voltage being different from the one of the plurality of reference voltages in response to an output signal from the sensor, wherein the controller includes a clock signal controller outputting a synchronized clock signal to perform data sensing in response to a main clock signal and a starting signal, wherein the clock signal includes a delay receiving the starting signal and delaying the starting signal for a period of time, a first logic unit receiving output signals from the delay and the main clock signal and outputting a signals having a logical NAND result, and a second logic unit receiving an output signals from output signals from the first logic unit and the starting signal and outputting a signal having a logic AND result to a clock signal at the latch, a latch coupled to the clock signal controller and latching input signals using the clock signal from the clock signal controller and outputting the input signals, wherein the latch includes a first flip-flop and a second flip-flop for latching a signal from the selector using the clock signal from the clock signal controller, a selector coupled to the latch and outputting signals to input terminals at the latch in response to the signal from the sensor to select a desired reference voltage, wherein the selector includes a third logic unit reversing the output signal from the sensor, a fourth logic unit reversing an output signal from the first flip-flop, a fifth logic unit receiving output signals from the fourth logic unit and the sensor and outputting a logic AND result to an input terminal at the first flip-flop, and a sixth logic unit receiving output signals from the third logic unit and the fourth logic unit and outputting a logical NOR result to an input terminal at the second flip-flop, and a decoder coupled to the latch and outputting a final reference voltage selection signal in response to the signals from the latch, wherein the decoder includes a seventh logic unit reversing an output signal from the first flip-flop, a eighth logic unit reversing an output signal from the second flip-flop, a ninth logic unit receiving output signals from the seventh and eighth logic units and the starting signal and outputting a first reference voltage selection signal, a tenth logic unit receiving output signals from the seventh logic unit, the starting signal and the second flip-flop and outputting a logical AND result as a second reference voltage selection signal, a eleventh logic unit receiving output signals from the seventh logic unit, the starting signal and the first flip-flop and outputting a logical AND result as a third reference voltage selection signal.

In another aspect, a method of data sensing an m-bit (where m is an integer greater than 1) memory cell includes a first step of generating $2^m-1$ different reference voltages, a second step of a first intermediate reference voltage between at least two of the reference voltages to a control gate of the memory cell and outputting a binary bit as a highest bit depending upon detection of a drain current from the memory cell, and a third step of a second intermediate reference voltage between at least two of the reference voltages among the reference voltages lower than the first intermediate reference voltage applied to the control gate when the drain current is detected in the second step, and applying a third intermediate reference voltage between at least two of the reference voltages among the reference voltages higher than the first intermediate reference voltage to the control gate at the memory cell when the drain current is not detected, so as to output a lowest bit by repeatedly outputting data depending on whether the drain current is detected.

In a further aspect, a method of data sensing an m-bit (where m is an integer greater than 1) memory cell includes a first step of generating $2^m-1$ different reference voltages, a second step of applying an intermediate reference voltage from at least two of the reference voltages to a control gate of the memory cell and outputting a binary bit as a highest bit depending upon detection of a drain current from the memory cell, the highest bit outputted being "0" when the drain current at the memory cell is detected and the highest bit outputted being "1" when the drain current of the memory cell is not detected, and a third step of applying a second intermediate reference voltage between at least two of the reference voltages among the reference voltages lower than the first intermediate reference voltage to the control gate when the drain current is detected in the second step, and applying the intermediate reference voltage among the reference voltages higher than the applied reference voltage to the control gate at the memory cell when the drain current is not detected, so as to output a lowest bit by repeatedly outputting data depending on whether the drain current is detected, the third step being repeated m−1 times.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the embodiments of the present invention, examples of which are illustrated in the accompanying drawings.

Figure 1:
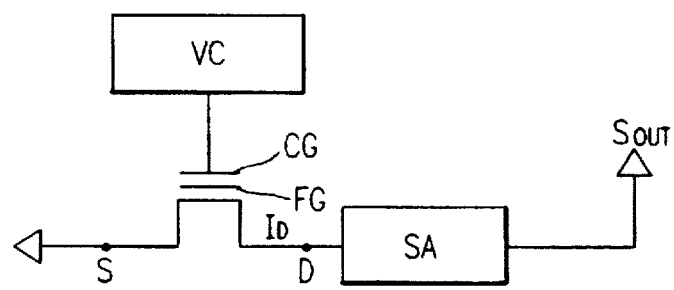
FIG. 1 is a block diagram of a data sensing apparatus of a conventional multi-bit memory cell.
Figure 2:
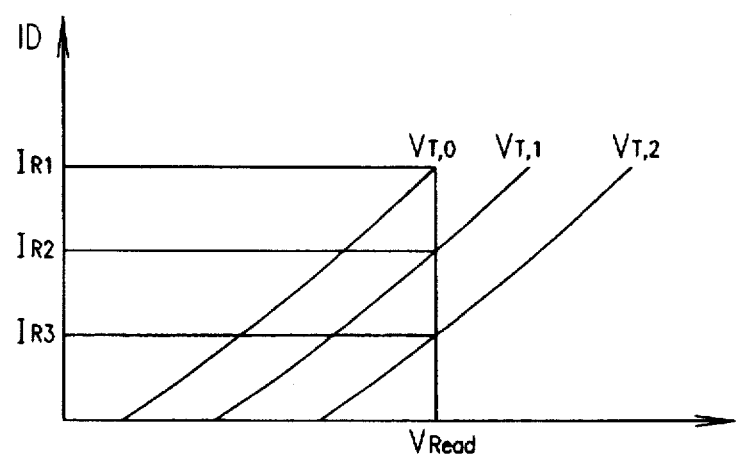
FIG. 2 is a graph showing an operation of a data sensing apparatus of a conventional multi-bit memory cell.
Figure 3:
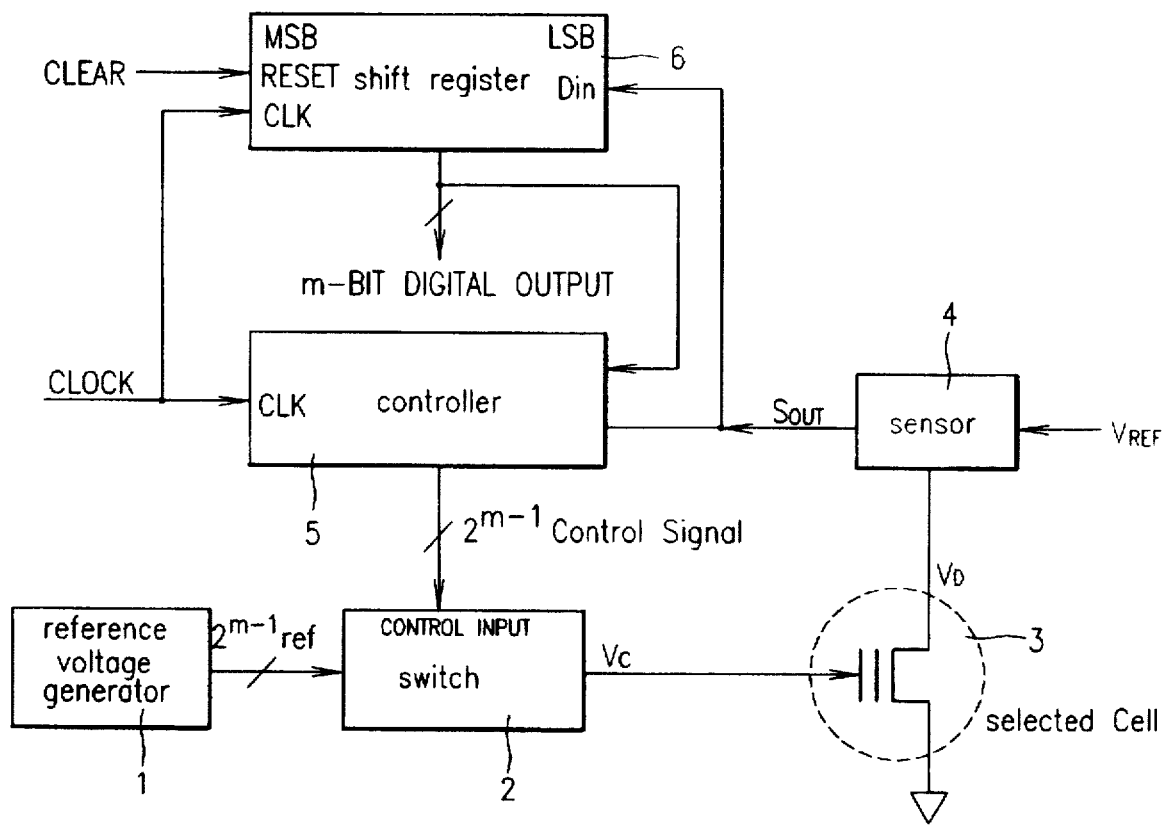
FIG. 3 is a block diagram of a data sensing apparatus of a multi-bit memory cell according to an embodiment of the present invention.

As illustrated in FIG. 3, the data sensing apparatus of a multi-bit memory cell according to the present invention includes a reference voltage generator 1, a switch 2, a memory cell 3, a sensor 4, a controller 5, and a shift resistor 6. The reference voltage generator 1 outputs a plurality of reference voltages (for example, $2^m-1$ voltages for m bits). The switch 2 outputs one of a plurality of reference voltages to a control gate of the memory cell 3. By comparing with a reference value, the sensor 4 outputs a drain current value from the memory cell 3 to which a reference voltage is applied. The shift register 6 outputs m-bit data which is read from the memory cell 3 by temporarily storing an output signal from the sensor 4. The controller 5 controls the switch 2 to output an intermediate reference voltage from the reference voltages by inputting an external clock signal and an output signal of the sensor 4. Also, the controller 5 determines where the reference voltage is applied and regulates the switch 2 to select a different intermediate reference voltage. For example, the reference voltage could be selected from the intermediate reference voltage that is smaller or larger than the applied reference voltage.

Figure 4:
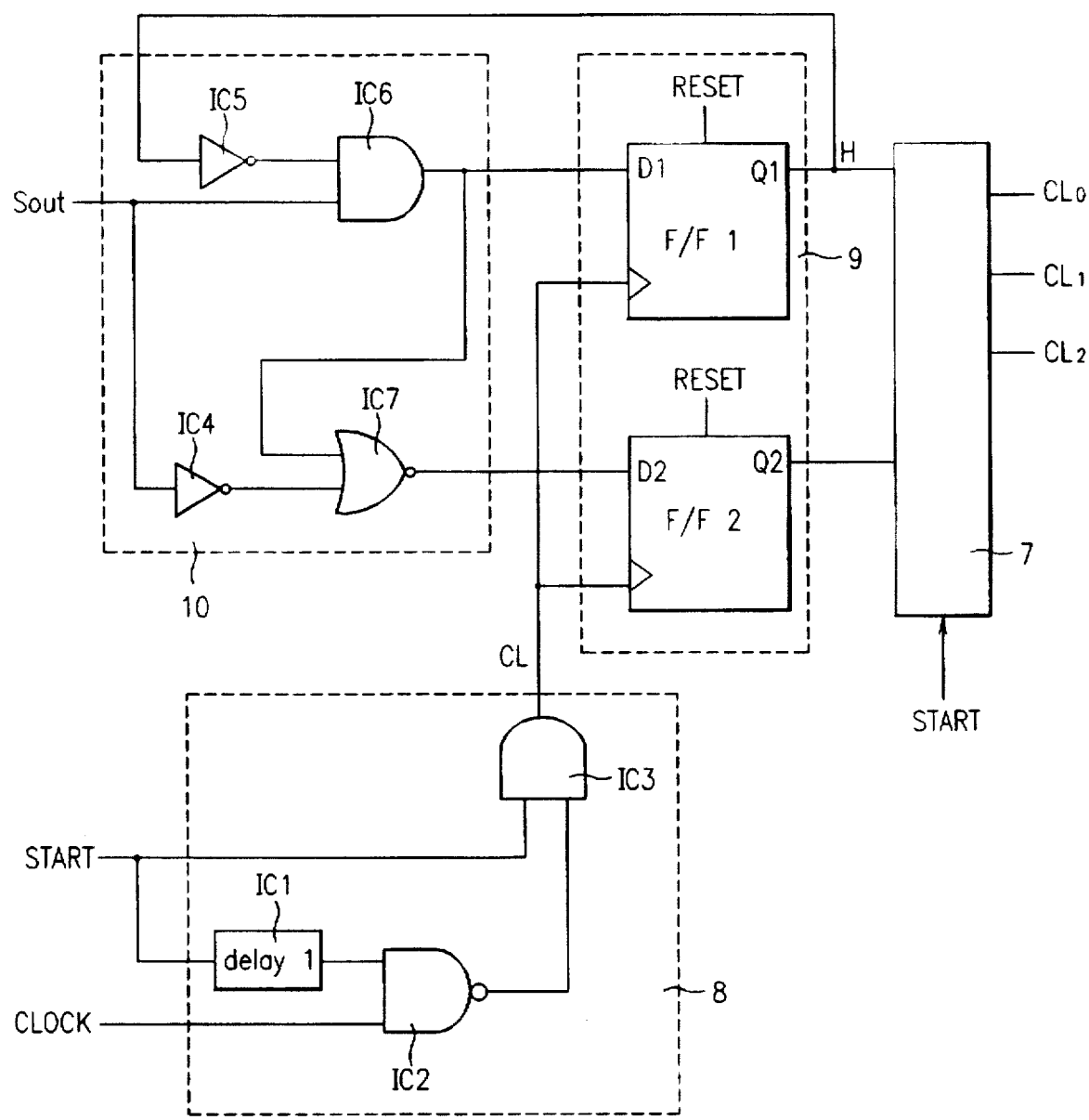
FIG. 4 is a detailed circuit diagram of a controller shown in FIG. 3.

As shown in FIG. 4, the controller 5 of FIG. 3 includes a clock signal controller 8 for outputting a synchronized clock signal CL to perform a data sensing by executing logic operations for a main clock signal CLOCK and a starting signal START, a latch 9 for latching signals inputted through the clock signal CL of the clock signal controller 8, a selector 10 for processing the output signals from the sensor 4 and the latch 9 and outputting processed signals to an input terminal at the latch 9 to select a desired reference voltage, and a decoder 7 for outputting reference voltage selection signals $CL_0$, $CL_1$, $CL_2$, ... to the switch 2 by performing logic operations on the output signals from the latch 9. The clock signal controller 8 includes a delay IC1 for delaying the starting signal START for a certain period of time, an NAND gate IC2 for performing a logic operation on the output signal from the delay IC1 and the main clock signal CLOCK, and a first AND gate IC3 for performing a logic operation on the output signals from the NAND gate IC2 and the starting signal START and outputting the resultant signals to clock signal inputs at the latch 9. The latch 9 includes first and second flip-flops F/F1, F/F2 for outputting signals through an output signal from the first AND gate IC3 at the clock signal controller 8.

The selector 10 includes a first inverter IC4 for reversing the output signal from the sensor 4. A second inverter IC5 reverses the output signal from the first flip-flop F/F1 for feedback. A second AND gate IC6 performs a logic operation on output signals from the second inverter IC5 and the sensor 4. The output signal from the second AND gate IC6 is applied to an input terminal at the first flip-flop F/F1. A NOR gate IC7 performs a logic operation on output signals from the first inverter IC4 and the second AND gate IC6. The output signal of the NOR gate IC7 is applied to an input terminal at the second flip-flop F/F2.

The controller 5 shown in FIG. 4 is an example of a 2-bit memory cell. In a multi-bit memory cell, the configurations of a logic gates and flip-flops depend on the number of bits.

Figure 5:
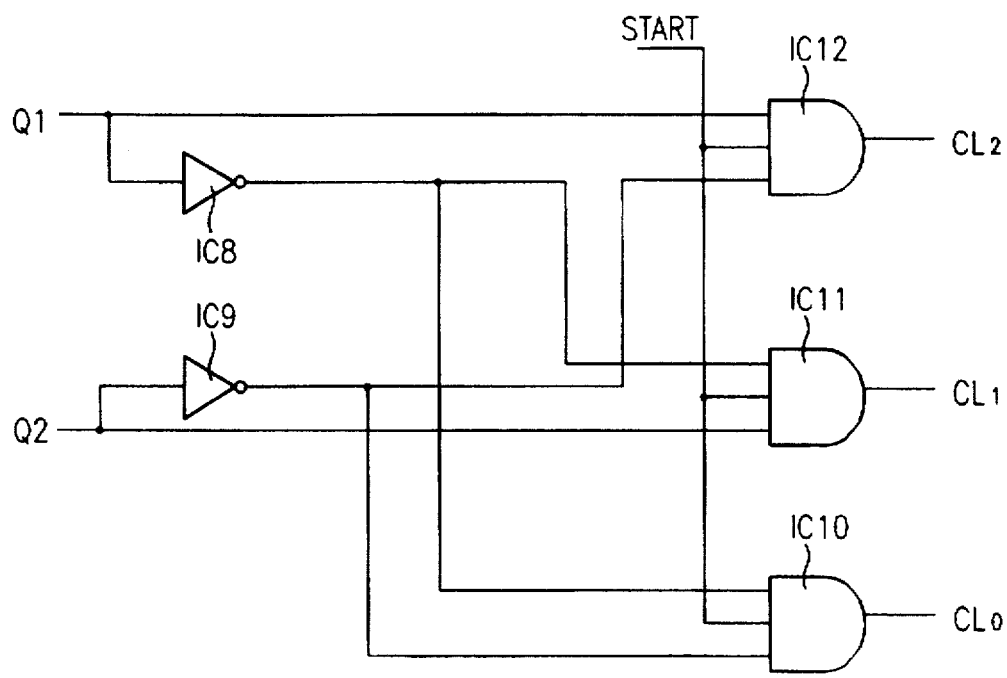
FIG. 5 is a detailed circuit diagram of a decoder shown in FIG. 4.

Referring to FIG. 5, the decoder 7 of FIG. 4 includes a third inverter IC8 for reversing an output signal from the first flip-flop F/F1, and a fourth inverter IC9 for reversing an output signal from the second flip-flop F/F2. A third AND gate IC10 performs logic operations on the starting signal START, and the outputs of the third and fourth inverters IC8, IC9 to output a first reference voltage selection signal $CL_0$. A fourth AND gate IC11 performs a logic operation on the output of the third inverter IC8, the starting signal START, and the output signal from the second flip-flop F/F2 to output a second reference voltage selection signal $CL_1$. A fifth AND gate IC12 performs a logic operation on the output of the fourth inverter IC9, the starting signal START, and an output signal from the first flip-flop F/F1 to output a third reference voltage selection signal $CL_2$.

For a data sensing apparatus of a memory cell programmed by m or more bits, the decoder 7 has $2^m-1$ AND gates.

Figure 6:
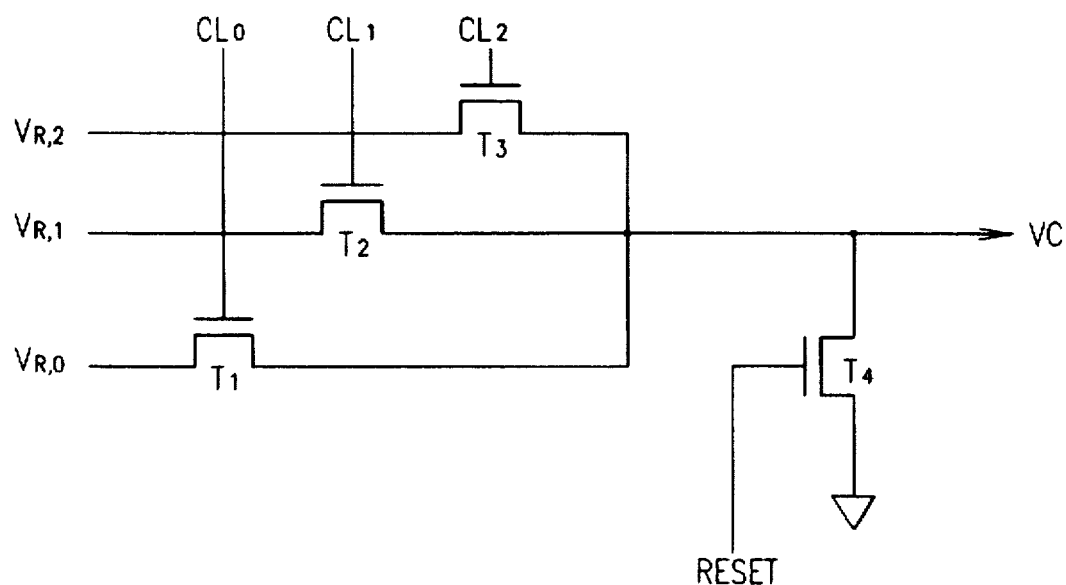
FIG. 6 is a detailed circuit diagram of a switch shown in FIG. 3.

Referring to FIG. 6, the switch 2 of FIG. 3 includes a plurality of transistors $T_1$, $T_2$, and $T_3$ for switching respectively a plurality of reference voltages ($2^m-1$ reference voltages) generated from the reference voltage generator 1 by the reference voltage selection signals $CL_0$, $CL_1$, $CL_2$ at the controller 5, and a transistor $T_4$ for clearing a reference voltage transmitted to an output terminal from the plurality of the transistors $T_1$, $T_2$, and $T_3$ by a reset signal RESET.

The data sensing method of a multi-bit memory cell according to the present invention will be described below with reference to the accompanying drawings.

Figure 8:
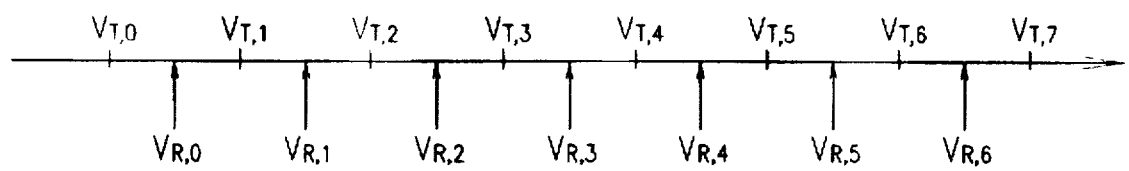
FIG. 8 shows threshold voltages of an m-bit cell and reference voltages corresponding to the threshold voltages according to the present invention.

As shown in FIG. 8, reference voltages are the intermediate values between the respective threshold voltages. For example, in a 3-bit memory cell, the threshold voltage may have eight levels ($2^3=8$). The threshold voltages having eight levels may be $V_{T,0}$, $V_{T,1}$, $V_{T,2}$, $V_{T,3}$, $V_{T,4}$, $V_{T,5}$, $V_{T,6}$ and $V_{T,7}$ and the reference voltages may be values between the respective threshold voltages, i.e., $V_{R,0}$, $V_{R,1}$, $V_{R,2}$, $V_{R,3}$, $V_{R,4}$, $V_{R,5}$, and $V_{R,6}$. In other words, if the threshold voltages are 1, 2, 3, 4, 5, 6, 7, and 8, the reference voltages become 1.5, 2.5, 3.5, 4.5, 5.5, 6.5, and 7.5, respectively. Thus, in an m-bit memory cell, the threshold voltages and the reference voltages may be $2^m$ and $2^m-1$, respectively.

The reference voltage generator 1 in FIG. 3 generates the reference voltages as described above.

Figure 9:
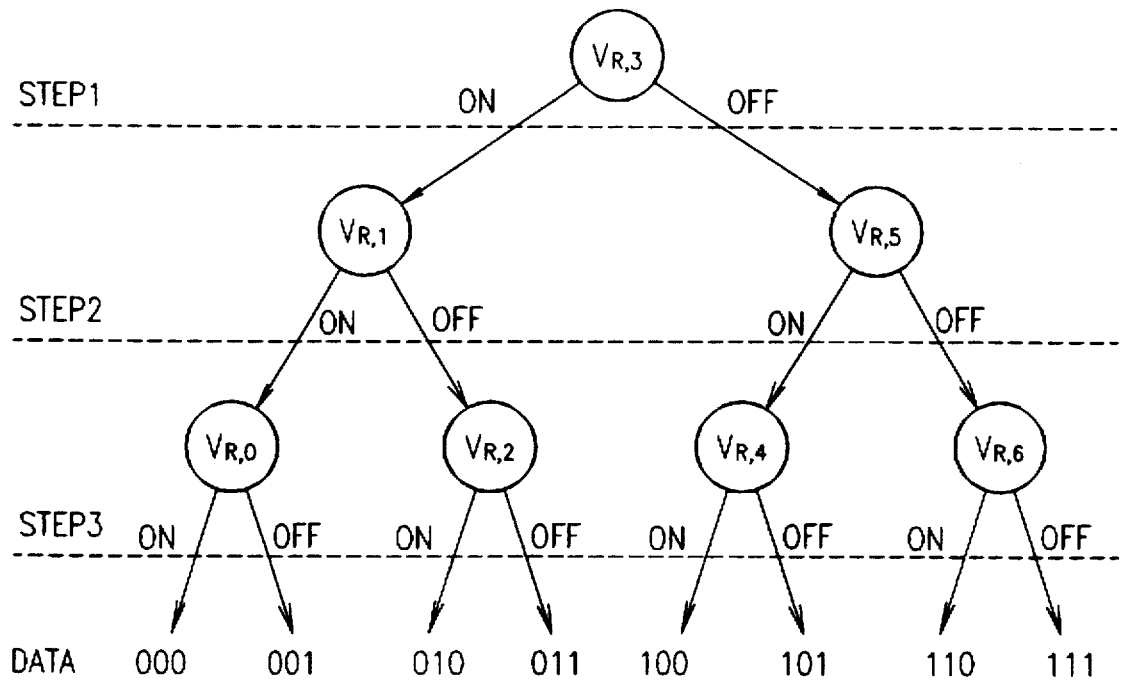
FIG. 9 shows an example selection of reference voltages according to the embodiment of the present invention.

With reference to FIG. 9, three steps of applying the generated reference voltages to the control gate at the memory cell 3 in response to the output signal from the Sensor 4 will be described using the reference voltage $V_{R,3}$ as an example.

In the first step, if a reference voltage higher than the threshold voltage programmed in the memory cell 3 is applied to the control gate at the memory cell 3, the memory cell is turned on. If a reference voltage lower than the threshold voltage is applied to the control gate of the memory cell 3, the memory cell is not turned on. If the memory cell 3 is turned on, the sensor 4 outputs a low signal. If not, the sensor 4 outputs a high signal.

For the purpose of explaining the data sensing method according to the present invention, it is assumed that the lowest data 000 is programmed to the lowest threshold voltage and the highest data ill to the highest threshold voltage for a 3-bit memory cell. It is also assumed that a 3-bit is programmed in one memory cell.

According to the data sensing method of the present invention, an intermediate($2^m/2$ th) reference voltage among the plurality ($2^m-1$) of reference voltages is applied to the control gate at the memory cell if the starting signal is inputted. That is, the reference voltage $V_{R,3}$ among the seven reference voltages shown in FIG. 8 is applied to the control gate at the memory cell 3 in the first step.

While the reference voltage $V_{R,3}$ in the first step, as aforementioned, is applied to the control gate at the memory cell 3, the memory cell 3 is turned on and the programmed threshold voltage is lower than the applied reference voltage $V_{R,3}$ if the output signal from the sensor 4 is low. That is, the threshold voltage programmed in the memory cell is one of $V_{T,0}$, $V_{T,1}$, $V_{T,2}$, and $V_{T,3}$. On the contrary, if the output signal of the sensor 4 is high, the memory cell 3 is not turned on and the programmed threshold voltage is higher than the applied reference voltage $V_{R,3}$. That is, the threshold voltage programmed in the memory cell 3 is one of $V_{T,4}$, $V_{T,5}$, $V_{T,6}$, and $V_{T,7}$.

Similarly, while the intermediate reference voltage $V_{R,3}$ in the first step is applied to the control gate at the memory cell, a reference voltage lower than the reference voltage in the first step is applied to the control gate at the memory cell in the second step if the output signal of the sensor 4 is low. Conversely, if the output signal of the sensor 4 is high, a reference voltage higher than the reference voltage in the first step is applied to the control gate at the memory cell in the second step.

Thus, in this process, the intermediate reference voltage among the reference voltages that is lower or higher than the reference voltage in the first step may be applied in the second step.

Again, while the reference voltage $V_{R,3}$ is applied, the intermediate ($2^m/4$ th) reference voltage $V_{R,1}$ that is lower than the reference voltage $V_{R,3}$ in the first step is applied in the second step if the output signal from the sensor 4 is low. If the output signal of the sensor 4 is high, the intermediate ($2^m/2+2^m/4$ th) reference voltage $V_{R,5}$ higher than the reference voltage in the first step is applied in the second step.

In the third step, the above steps are repeated with alternative procedures depending upon the output signal from the sensor 4 while the reference voltage $V_{R,1}$ or $V_{R,5}$ in the second step is applied to the control gate at the memory cell.

Assuming $V_{R,1}$ in the second step, if the output signal from the sensor 4 is low, the reference voltage $V_{R,0}$ that is lower than the reference voltage $V_{R,1}$ in the second step is applied to the control gate at the memory cell in the third step. Alternatively, in the third step, the reference voltage $V_{R,2}$ that is higher than the reference voltage $V_{R,1}$ in the second step is applied to the control gate at the memory cell if the output signal from the sensor 4 is high.

Further, assuming $V_{R,5}$ in the second step, if the reference voltage $V_{R,5}$ in the second step is applied to the control gate and the output signal from the sensor 4 is low, the reference voltage $V_{R,4}$ that is lower than the reference voltage $V_{R,5}$ in the second step is applied to the control gate at the memory cell in the third step. If the reference voltage $V_{R,5}$ of the second step is applied to the control gate at the memory cell and the output signal from the sensor 4 is high, the reference voltage $V_{R,6}$ that is higher than the reference voltage $V_{R,5}$ in the second step is applied to the control gate in the third step.

Thus, in the third step, one of the reference voltages, $V_{R,0}$, $V_{R,2}$, $V_{R,4}$, and $V_{R,6}$ is applied to the control gate at the memory cell, depending on whether $V_{R,1}$ or $V_{R,5}$ is selected in the second step.

Consequently, the programmed data is read in response to the reference voltages and the output signals from the sensor 4 in the third step. That is, if the reference voltage $V_{R,0}$ is applied to the control gate at the memory cell and the output signal from the sensor 4 is low, data 000 is programmed. If the output signal from the sensor 4 is high, data 001 is programmed at the memory cell. Moreover, if the reference voltage $V_{R,2}$ is applied to the control gate and the output signal is low, data 010 is programmed. If the output signal from the sensor 4 is high, data 011 is programmed.

Similarly, if the reference voltage is $V_{R,4}$ and the output signal is low, data 100 is programmed at the memory cell. If the output signal from the sensor 4 is high, data 101 is programmed. Data 110 is programmed at the memory cell if the reference voltage is $V_{R,6}$ and the output signal from the sensor 4 is low. If the output signal of the sensor is high, data 111 is programmed at the memory cell.

In the memory cell for programming m-bit ($2^m$ threshold voltages) of the present invention, the reference voltage is applied m times for data sensing. For example, the reference voltage is applied three times for programming 3 bits in the memory cell.

Figure 7:
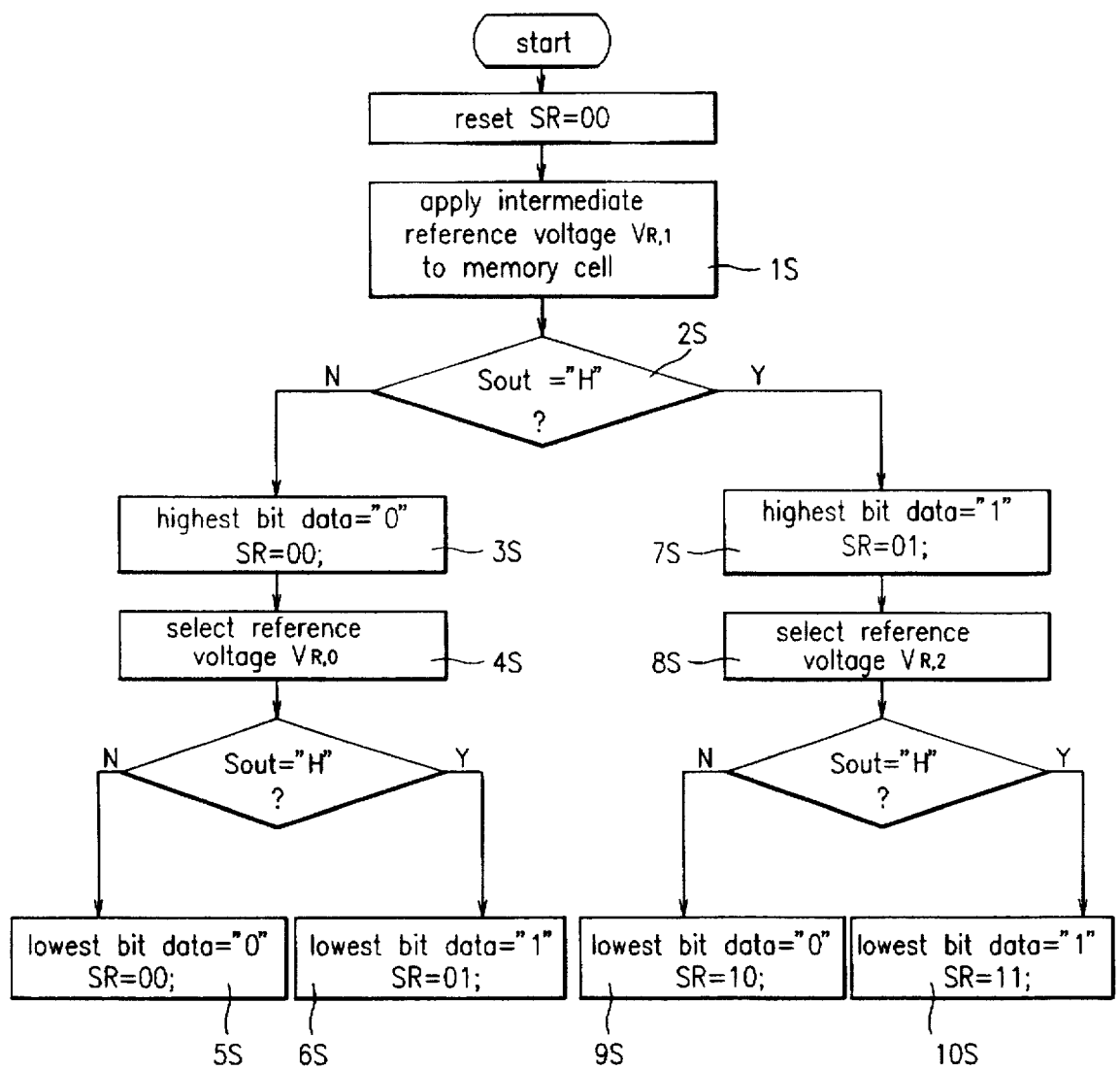
FIG. 7 is a sequence diagram showing a data sensing operation of a multi-bit memory cell according to the embodiment of the present invention.
Figure 10:
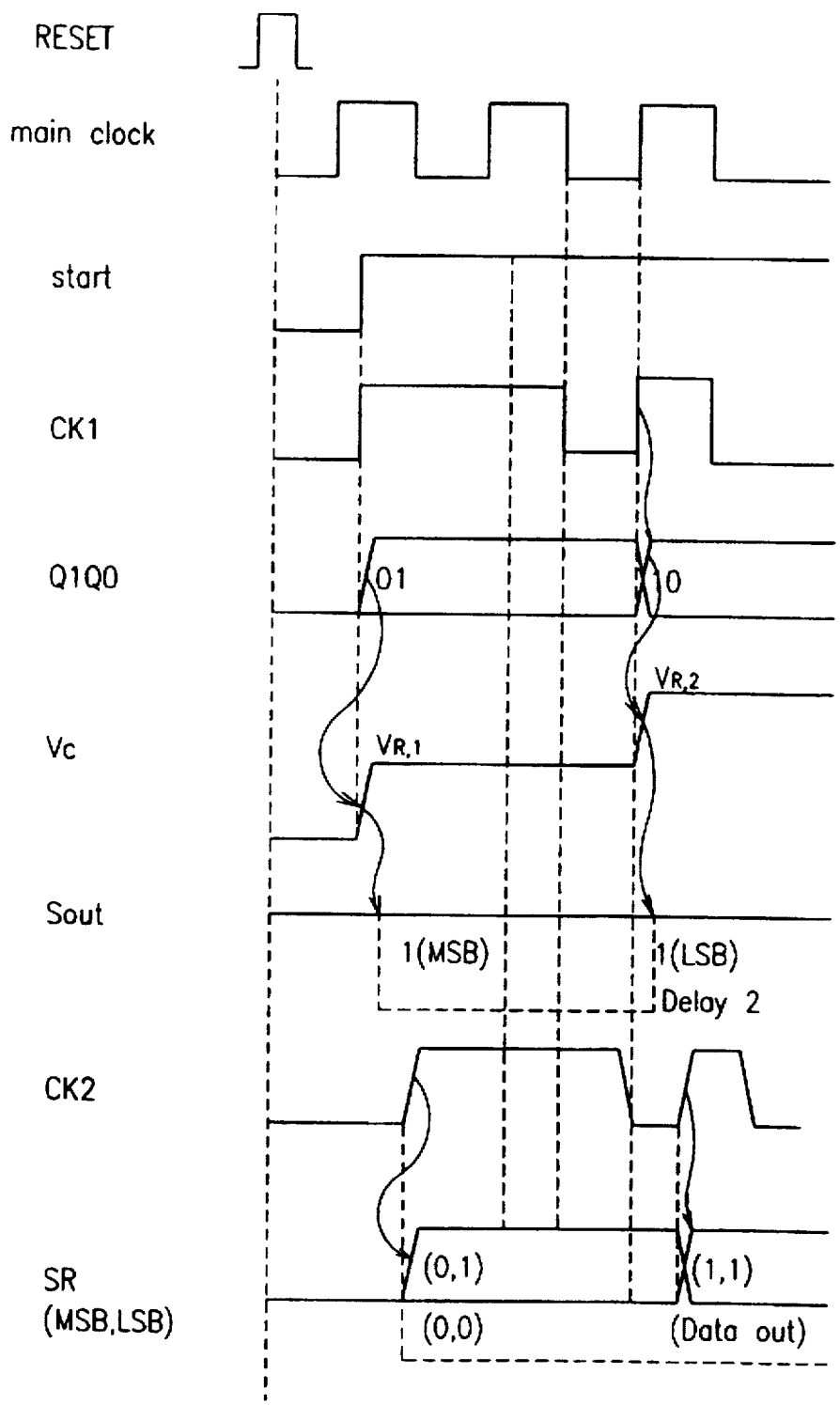
FIG. 10 is a timing chart for a data sensing method of a multi-bit memory cell according to the present invention.

The operation of the data sensing apparatus of a multi-bit memory cell as aforementioned will be described with reference to FIGS. 7, and 10. FIG. 7 shows the operation sequence for reading 2-bit. In 2-bit data sensing, three reference voltages are needed as described above. FIG. 10 is a timing chart showing various waveforms of relevant signals in the present invention.

In step 1S, while a main clock signal CLOCK is applied and reset, the intermediate reference voltage $V_{R,1}$ at the controller 5 (FIG. 3) is applied to the control gate at the memory cell when the starting signal START is input. The sensing amplifier 4 detects a drain current from the memory cell having the applied reference voltage Then, it outputs a low or high signal depending upon whether the drain current is detected in step 2S.

If the output signal from the sensor 4 is low, "0" is shifted as the highest bit to be sensed in a shift register 6 in step 3S. In step 4S, the reference voltage $V_{R,0}$ that is lower than the initial reference voltage is applied to the control gate at the memory cell 3 by the controller 5 consistent with the next clock signal.

While the reference voltage $V_{R,0}$ is applied to the control gate, if the drain current detected by the sensor 4 is low, "0" is shifted as the lowest bit to be sensed in the shift register 6 in step 5S. If the drain current is high, "1" is shifted as the lowest bit to be sensed in the shift register 6 in step 6S.

Referring back to the step 2S, if the output signal from the sensor 4 is high, "1" is shifted as the highest bit to be sensed in the shift register 6 in step 7S. In step 8S, the reference voltage $V_{R,2}$ that is higher than the initial reference voltage is 5 applied to the control gate at the memory cell 3 by the controller 5 consistent with the next clock signal.

If the drain current from the memory cell detected by the sensor 4 is low, "0" is shifted as the lowest bit to be sensed in the shift register 6 in step 9S. In step 10S, "1" is shifted as the lowest bit to be sensed in the shift register 6 if the drain current is high.

As aforementioned, in 2-bit data sensing, the reference voltage is applied twice to the control gate at the memory cell, and then data sensing is performed by outputting data in sequence from the highest bit to the lowest bit.

Now, the operation of the controller 5 will be described with reference to FIG. 4.

At the initial state before inputting the starting signal START, the sensor 4 (FIG. 3) always outputs a high signal and flip-flops F/F1 and F/F2 output low signals. Thus, the output signals from the second AND gate IC6 and the NOR gate IC7 are high and low, respectively. Thus, the high signal is applied to the input terminal D1 at the first flip-flop F/F1 whereas the low signal is applied to the input terminal D2 at the second flip-flop F/F2.

On the other hand, if the starting signal START is input to the delay IC1 at the controller 5 and the first AND gate IC3 while the main clock signal CLOCK is applied and reset, the delay IC1 delays the starting signal for a certain period of time to transmit the signal to the NAND gate IC2. The first AND gate IC3 outputs a high signal for the delayed time irrespective of the main clock signal. Therefore, the clock signal CK is applied to the first and second flip-flops F/F1, F/F2. When the clock signal is applied to the first and second flip-flops F/F1, F/F2 as described above, the first flip-flop F/F1 outputs a high signal and the second flip-flop F/F2 outputs a low signal.

Thus, as shown in FIG. 5, the decoder 7 outputs an intermediate selection signal $CL_1$ among the reference voltage selection signals as a high signal to apply the intermediate reference voltage $V_{R,1}$ from the three reference voltages to the control gate at the memory cell 3. If the intermediate reference voltage $V_{R,1}$ is applied to the memory cell 3, the output signal from the sensor 4 varies depending on how the memory cell 3 is programmed. That is, if the memory cell 3 is programmed by a threshold voltage level lower than the intermediate reference voltage $V_{R,1}$, the sensor 4 outputs a low signal. However, the sensor 4 outputs a high signal if the cell is programmed by a threshold voltage level higher than the intermediate reference voltage $V_{R,1}$.

As aforementioned, if the intermediate reference voltage $V_{R,1}$ is applied to the control gate of the memory cell, the output signal at the sensor 4 is recognized by the controller 5, so that the lowest reference voltage or the highest reference voltage is selected again.

If the output signal from the sensor 4 is low, the output signals from the first NOR gate IC7 and the first AND gate IC6 are also low. Thus, a low signal is applied to the input terminals at the flip-flops F/F1, F/F2. Then, the starting signal delayed for a certain time period in the delay IC1 is applied to the NAND gate IC2. The NAND gate IC2 reverses an output from the main clock signal. The AND gate IC3 outputs the signal received from the NAND gate IC2 as clock signals in the respective flip-flops F/F1, F/F2.

Thus, the flip-flops F/F1, F/F2 output low signals to the decoder 7. The decoder 7 outputs the reference voltage selection signal $CL_0$ as a high signal to select the lowest reference voltage $V_{R,0}$.

On the contrary, if the output signal from the sensor 4 is high while the intermediate reference voltage $V_{R,1}$ is applied to the control gate at the memory cell, a low signal is applied to the input terminal D1 at the first flip-flop F/F1 and a high signal is applied to D2 at the second flip-flop F/F2. Thus, the respective flip-flops output a low signal and a high signal, respectively, as clock signals. Thus, the decoder 7 outputs the reference voltage selection signal $CL_2$ as a high signal to select the highest reference voltage $V_{R,2}$.

As aforementioned, the intermediate reference voltage $V_{R,1}$ is applied to the control gate by the controller 5 as soon as the starting signal is delayed as a high signal. Also, the sensor 4 outputs a lower reference voltage $V_{R,0}$ or a higher reference voltage $V_{R,2}$ in the reference voltages.

The reference voltage from the sensor 4 is applied to the controller 5, and then finally to the shift register 6 to output the data. That is, if the output signal from the sensor 4 is high while the intermediate reference voltage $V_{R,1}$ is applied to the control gate, a reference voltage $V_{R,2}$ that is higher than the intermediate reference voltage $V_{R,1}$, is applied to the control gate by the controller 5. At the same time, data 01 is stored in the shift register 6. If the output signal from the sensor 4 is low, a reference voltage $V_{R,0}$, which is lower than the intermediate reference voltage $V_{R,1}$, is applied to the control gate by the controller 5. Similarly, data 00 is stored in the shift register 6.

Further, if the output signal from the sensor is high while a reference voltage $V_{R,2}$ that is higher than the intermediate reference voltage $V_{R,1}$ is applied to the control gate at the memory cell, data 11 is stored in the shift register 6. If the output signal from the sensor is low, data 10 is stored in the shift register 6.

As aforementioned, when the memory cell is programmed by a 2-bit level, the reference voltage is applied twice and the data 11, 10, 01, or 00 is output depending on the output signal from the sensor 4.

The data sensing apparatus and method of a multi-bit memory cell according to the present invention has at least the following advantages. Since multi-level reference voltages are applied for the data sensing, power consumption is decreased by reducing the size of the sensing amplifier. In addition, since an m-bit memory cell is programmed by $2^m$ threshold voltages to perform the data sensing by applying the reference voltage m times, the data sensing speed can be improved and the power consumption can be reduced.

It will be apparent to those skilled in the art that various modifications and variations can be made in the data sensing apparatus and method of a multi-bit memory cell of the present invention without departing from the spirit or scope of the invention. Thus, it is intended that the present invention cover the modifications and variations of the invention provided they come within the scope of the appended claims and their equivalents.

What is claimed is:

1. An apparatus for sensing data in a multi-bit memory cell having a control gate comprising:

a reference voltage generator generating a plurality of reference voltages;

a switch coupled to the reference voltage generator and outputting one of the plurality of reference voltages to the control gate of the memory cell;

a sensor coupled to the multi-bit memory cell and sensing an output signal from the memory cell;

a controller coupled to the switch and the sensor and controlling the switch to apply an intermediate reference voltage selected from the plurality of reference voltages to the control gate, the intermediate reference voltage being different from the one of the plurality of reference voltages in response to an output signal from the sensor; and a shift register coupled to the sensor and outputting an m-bit signal, the shift register shifting the output signal received from the sensor.

2. The apparatus according to claim 1, wherein the switch comprises:

a plurality of first transistors having outputs and respectively switching the plurality of reference voltages generated from the reference voltage generator in accordance with the controller; and a second transistor coupled to the plurality of first transistors and setting the outputs of the plurality of first transistors to a reset state.

3. The apparatus according to claim 1, wherein the controller comprises:

a clock signal controller outputting a synchronized clock signal to perform data sensing in response to a main clock signal and a starting signal;

a latch coupled to the clock signal controller and latching input signals using the synchronized clock signal from the clock signal controller and outputting the input signals;

a selector coupled to the latch and outputting signals to the input terminals of the latch in response to the output signal from the sensor to select a desired reference voltage; and a decoder coupled to the latch and outputting a final reference voltage selection signal in response to the signals output from the latch.

4. The apparatus according to claim 3, wherein the clock signal controller comprises:

a delay receiving the starting signal and delaying the starting signal for a period of time;

a first logic unit receiving an output signal from the delay and the main clock signal and outputting a signal having a logical NAND result; and a second logic unit receiving the signal from the first logic unit and the starting signal and outputting a signal having a logical AND result to a clock signal input of the latch.

5. The apparatus according to claim 3, wherein the latch comprises a first flip-flop and a second flip-flop for latching signals from the selector using the synchronized clock signal from the clock signal controller.

6. The apparatus according to claim 3, wherein the selector comprises:

a first logic unit reversing the output signal from the sensor;

a second logic unit reversing an output signal from the latch;

a third logic unit receiving output signals from the second logic unit and the sensor and outputting a signal having a logical AND result to a first input terminal of the latch; and a fourth logic unit receiving output signals from the first logic unit and the third logic unit and outputting a signal having a logical NOR result to a second input terminal of the latch.

7. The apparatus according to claim 3, wherein the decoder comprises:
a first logic unit reversing a first output signal from the latch; p1 a second logic unit reversing a second output signal from the latch;
a third logic unit receiving output signals from the first and second logic units and the starting signal and outputting a first logical AND result as a first reference voltage selection signal;
a fourth logic unit receiving output signals from the first logic unit, the starting signal, and the latch and outputting a second logical AND result as a second reference voltage selection signal; and
a fifth logic unit receiving output signals from the second logic unit, the starting signal, and the latch and outputting a third logical AND result as a third reference voltage selection signal.

8. An apparatus for sensing data in a multi-bit memory cell having a control gate comprising:
a reference voltage generator generating a plurality of reference voltages;
a switch coupled to the reference voltage generator and outputting one of the plurality of reference voltages to the control gate of the memory cell, wherein the switch includes
a plurality of first transistors having outputs and respectively switching the plurality of reference voltages generated from the reference voltage generator in accordance with a controller and a second transistor coupled to the plurality of first transistors and setting the outputs of the plurality of first transistors to a reset state;
a sensor coupled to the multi-bit memory cell and sensing an output signal from the memory cell;
a shift register coupled to the sensor and outputting an m-bit signal, the shift register shifting the output signal received from the sensor; and
the controller coupled to the switch and the sensor controlling the switch to apply an intermediate reference voltage selected from the plurality of reference voltages to the control gate, the intermediate reference voltage being different from the one of the plurality of reference voltages in response to an output signal from the sensor, wherein the controller includes
a clock signal controller outputting a synchronized clock signal to perform data sensing in response to a main clock signal and a starting signal,
a latch coupled to the clock signal controller and latching input signals using the synchronized clock signal from the clock signal controller and outputting the input signals,
a selector coupled to the latch and outputting signals to the input terminals of the latch in response to the output signal from the sensor to select a desired reference voltage, and
a decoder coupled to the latch and outputting a final reference voltage selection signal in response to the signals output from the latch.

9. The apparatus according to claim 8, wherein the clock signal controller comprises:
a delay receiving the starting signal and delaying the starting signal for a period of time;
a first logic unit receiving output signals from the delay and the main clock signal and outputting a signal having a logical NAND result; and a second logic unit receiving an output signal from the first logic unit and the starting signal and outputting a signal having a logic AND result to a clock signal input of the latch.

10. The apparatus according to claim 8, wherein the latch comprises a first flip-flop and a second flip-flop for latching signals output from the selector using the synchronized clock signal from the clock signal controller.

11. The apparatus according to claim 8, wherein the selector comprises:
a first logic unit reversing the output signal from the sensor;
a second logic unit reversing an output signal from the latch;
a third logic unit receiving output signals from the second logic unit and the sensor and outputting a logical AND result to a first input terminal of the latch; and
a fourth logic unit receiving output signals from the first logic unit and the third logic unit and outputting a logical NOR result to a second input terminal of the latch.

12. The apparatus according to claim 8, wherein the decoder comprises:
a first logic unit reversing a first output signal from the latch;
a second logic unit reversing a second output signal from the latch;
a third logic unit receiving output signals from the first and second logic units and the starting signal and outputting a first logic AND result as a first reference voltage selection signal;
a fourth logic unit receiving output signals from the first logic unit, the starting signal, and the latch and outputting a second logic AND result as a second reference voltage selection signal; and
a fifth logic unit receiving output signals from the second logic unit, the starting signal, and the latch and outputting a third logical AND result as a third reference voltage selection signal.

13. A method of data sensing an m-bit (where m is an integer greater than 1) memory cell, the method comprising the steps of:
a first step of generating $2^m-1$ different reference voltages;
a second step of applying a first intermediate reference voltage between at least two of the reference voltages to a control gate of the memory cell and outputting a binary bit as a highest bit depending upon detection of a drain current from the memory cell; and
a third step of applying a second intermediate reference voltage between at least two of the reference voltages among the reference voltages lower than the first intermediate reference voltage applied to the control gate when the drain current is detected in the second step, and applying a third intermediate reference voltage between at least two of the reference voltages among the reference voltages higher than the first intermediate reference voltage applied to the control gate of the memory cell when the drain current is not detected, so as to output a lowest bit by repeatedly outputting data depending on whether the drain current is detected.

14. The method according to claim 13, wherein the binary bit in the second step is output as a "0" when the drain current of the memory cell is detected.

15. The method according to claim 13, wherein the binary bit in the second step is output as a "1" when the drain current of the memory cell is not detected.

16. The method according to claim 13, wherein the third step is repeated m−1 times.

17. A method of data sensing an m-bit (where m is an integer greater than 1) memory cell, the method comprising three steps of:

a first step of generating $2^m-1$ different reference voltages;

a second step of applying a first intermediate reference voltage from at least two of the reference voltages to a control gate of the memory cell and outputting a binary bit as a highest bit depending upon detection of a drain current from the memory cell, the highest bit being output as a "0" when the drain current of the memory cell is detected and the highest bit being output as a "1" when the drain current of the memory cell is not detected;

a third step of applying a second intermediate reference voltage between at least two of the reference voltages among the reference voltages lower than the first intermediate reference voltage applied to the control gate when the drain current is detected in the second step, and applying a third intermediate reference voltage between at least two of the reference voltages among the reference voltages higher than the first intermediate reference voltage applied to the control gate of the memory cell when the drain current is not detected, so as to output a lowest bit by repeatedly outputting data depending on whether the drain current is detected; and a fourth step of repeating the third step m−1 times.

* * * * *